United States Patent
Joshi et al.

(10) Patent No.: US 11,663,458 B2
(45) Date of Patent: May 30, 2023

(54) CONDUCTANCE DRIFT CORRECTIONS IN NEUROMORPHIC SYSTEMS BASED ON CROSSBAR ARRAY STRUCTURES

(71) Applicant: International Business Machines Corporation, Armonk, NY (US)

(72) Inventors: Vinay Manikrao Joshi, Ruschlikon (CH); Simon Haefeli, Gland (CH); Manuel Le Gallo-Bourdeau, Zurich (CH); Irem Boybat Kara, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 16/842,874

(22) Filed: Apr. 8, 2020

(65) Prior Publication Data

US 2021/0319300 A1   Oct. 14, 2021

(51) Int. Cl.
*G06N 3/065* (2023.01)
*G06F 7/50* (2006.01)
*G06F 7/523* (2006.01)
*G11C 11/40* (2006.01)

(52) U.S. Cl.
CPC ........... *G06N 3/065* (2023.01); *G06F 7/50* (2013.01); *G06F 7/523* (2013.01); *G11C 11/40* (2013.01)

(58) Field of Classification Search
CPC ..................................................... G06N 3/0635
See application file for complete search history.

(56) References Cited

U.S. PATENT DOCUMENTS

| | | | |
|---|---|---|---|
| 10,079,058 B1 * | 9/2018 | Eleftheriou | G11C 13/0023 |
| 2020/0234480 A1 * | 7/2020 | Volkov | G06V 40/171 |
| 2020/0380350 A1 * | 12/2020 | Lesso | G06N 3/04 |
| 2021/0365765 A1 * | 11/2021 | Kim | G06N 3/063 |

FOREIGN PATENT DOCUMENTS

KR    101979987 B1    5/2019

OTHER PUBLICATIONS

Le Gallo et al., "Mixed-Precision In-Memory Computing", IBM Research, 10 pages, Dated Oct. 3, 2018.
Le Gallo et al., "Compressed Sensing Recovery Using Computational Memory", 4 pages, IBM Research, IEDM17-664, 2017.

* cited by examiner

*Primary Examiner* — Douglas King
(74) *Attorney, Agent, or Firm* — Jeffrey M. Ingalls (57) ABSTRACT

A method of operating a neuromorphic system is provided. The method includes applying voltage signals across input lines of a crossbar array structure, the crossbar array structure including rows and columns interconnected at junctions via programmable electronic devices, the rows including the input lines for applying voltage signals across the electronic devices and the columns including output lines for outputting currents. The method also includes correcting, via a correction unit connected to the output lines, each of the output currents obtained at the output lines according to an affine transformation to compensate for temporal conductance variations in the electronic devices.

16 Claims, 4 Drawing Sheets

CONDUCTANCE DRIFT CORRECTIONS IN NEUROMORPHIC SYSTEMS BASED ON CROSSBAR ARRAY STRUCTURES

BACKGROUND

The present disclosure relates in general to the field of neuromorphic systems based on crossbar array structures, and to methods of operating such neuromorphic systems. In particular, the present disclosure is directed to techniques to compensate for temporal conductance variations (such as conductance drifts) in electronic devices (e.g., phase-change memory (PCM) devices) of crossbar array structures of such systems.

Machine learning often relies on artificial neural networks (ANNs), which are computational models inspired by biological neural networks in human or animal brains. Such systems progressively and autonomously learn tasks by means of examples, and they have successfully been applied to, for example, speech recognition, text processing and computer vision.

Many types of neural networks are known, starting with feedforward neural networks, such as multilayer perceptrons, deep neural networks and convolutional neural networks. Neural networks are typically implemented in software. However, a neural network may also be implemented in hardware, for example, as a resistive processing unit using a crossbar array structure or as an optical neuromorphic system. Such systems may be used as external memory for memory-augmented systems. The basic idea of memory-augmented neural networks is to enhance a neural network with an external memory. Memory-augmented neural networks (MANNs) benefit from a powerful architecture combining advantages from neural network data processing and persistent storage.

Computational memories based on crossbar arrays using electronic devices such as PCM devices can be used for ANN computations, for example, for training a deep neural network (DNN) and/or as inference accelerators for inferences with such networks. However, certain electronics devices (e.g., PCM devices) may suffer from temporal variations (e.g., drifts) in their conductance values, which may lead to errors in the computations. Being able to correct such variations in the conductance values with reliable precision may be desirable, especially for DNN inference accelerators.

SUMMARY

In certain embodiments, a method of operating a neuromorphic system includes applying voltage signals across input lines of a crossbar array structure, the crossbar array structure including rows and columns interconnected at junctions via programmable electronic devices, the rows including the input lines for applying voltage signals across the electronic devices and the columns including output lines for outputting currents. The method also includes correcting, via a correction unit connected to the output lines, each of the output currents obtained at the output lines according to an affine transformation to compensate for temporal conductance variations in the electronic devices.

In other embodiments, a neuromorphic system includes a crossbar array structure that includes rows and columns interconnected at first junctions via electronic devices, wherein the rows include input lines for applying voltage signals across the electronic devices and the columns include output lines for outputting currents. The neuromorphic system also includes a correction unit connected to the output lines and configured to enable an affine transformation of currents outputted from each of the output lines. The neuromorphic system also includes a control unit configured to apply voltage signals across the input lines, and configured operate the correction unit to correct each of the output currents obtained at the output lines according to the affine transformation, to compensate for temporal conductance variations in the electronic devices.

Systems and methods embodying the present invention will now be described, by way of non-limiting examples, and in reference to the accompanying drawings

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments. Technical features depicted in the drawings are not necessarily to scale. Similar or functionally similar elements in the figures have been allocated the same numeral references, unless otherwise indicated.

DETAILED DESCRIPTION

As discussed above, certain electronics devices (e.g., PCM devices) may suffer from temporal variations (e.g., drifts) in their conductance values, which may lead to errors in the computations. The drift in the conductance value of a PCM device limits its applications in DNN inference hardware accelerators and potentially in DNN training hardware accelerators as well. An example drift correction technique includes a method for correcting conductance drifts in a crossbar implementation of PCM devices. The method relies on computing a single scalar factor to correct for drifted conductance values of all currents outputted from the crossbar array. The method is based on the observation that the conductance of an electronic device such as a PCM device has an exponential relation to the time. Certain of these methods may be able to achieve a limited amount of error reduction when computing a matrix multiplication (e.g., in performing multiply-accumulate operations). However, a more precise method for correcting the error caused by the drift in the conductance is needed for maintaining high DNN inference accuracies.

The present embodiments describe improved methods for error reduction, where the output currents are corrected according to an affine transformation. In addition, the methods of the present embodiments may be used to separately correct output currents of distinct subsets of output lines (or distinct output lines), or as part of a batch normalization procedure, as discussed below in detail.

An embodiment relates to a hardware-implemented method of operating a neuromorphic system. The method relies on a neuromorphic system, which comprises a crossbar array structure and a correction unit. The crossbar array structure includes rows and columns interconnected at junctions via programmable electronic devices. The rows include input lines for applying voltage signals across the electronic devices and the columns include output lines for outputting currents. The correction unit is connected to said output lines. This unit is configured to enable an affine transformation of currents outputted from each of said output lines, in operation. The method involves, on the one hand, applying voltage signals across the input lines and, on the other hand, correcting (via the correction unit) each of the output currents obtained at said output lines according to said affine transformation to compensate for temporal conductance variations in said electronic devices.

In embodiments, the correction of the output currents is achieved by programming the correction unit according to programmable parameters of the affine transformation. These parameters include a multiplicative coefficient $\gamma$ and an additive parameter $\beta$. Thus, each of the output currents is corrected according to programmable parameters. The correction unit is preferably integrated in the crossbar array structure. It may for example be connected to the output lines of the crossbar array structure via second electronic devices at second junctions. In this case, each output current can be corrected via the correction unit by programming the latter based on signals coupled into each of the second junctions. One or more set of values may possibly be computed for the programmable parameters. For example, the correction unit may be programmed according to two or more sets of values, so as to separately correct two or more sets of output currents, respectively. Interestingly, the crossbar array structure may further include one or more additional columns for outputting one or more reference currents. Such reference currents may then be used to compute the sets of values for the affine parameters.

In other embodiments, the crossbar array structure is used to execute a layer of nodes of an artificial neural network. Batch normalization parameters can advantageously be computed in view of performing a batch normalization of this layer. This can be achieved by scaling the multiplicative coefficient $\gamma$ and the additive parameter $\beta$ of the affine transformation according to the computed batch normalization parameters.

Other embodiments relate to a neuromorphic system. The system comprises a crossbar array structure and a correction unit as described above. The system further includes a control unit configured to apply voltage signals across the input lines. The control unit is further configured to operate the correction unit, in order to correct each of the output currents obtained at the output lines according to an affine transformation, so as to compensate for temporal conductance variations in said electronic devices. The correction unit may possibly be integrated in the crossbar array structure. So may the control unit, although it is preferably implemented as a digital, processing unit.

In reference to FIGS. 1-4, an aspect which concerns a hardware-implemented method of operating a neuromorphic system 1 is described, according to certain embodiments. The present method and its variants are collectively referred to as "the present methods." All references to "Sij" refer to methods steps of the flowchart of FIG. 4, while numeral references pertain to physical parts or components of the system 1.

Figure 1:
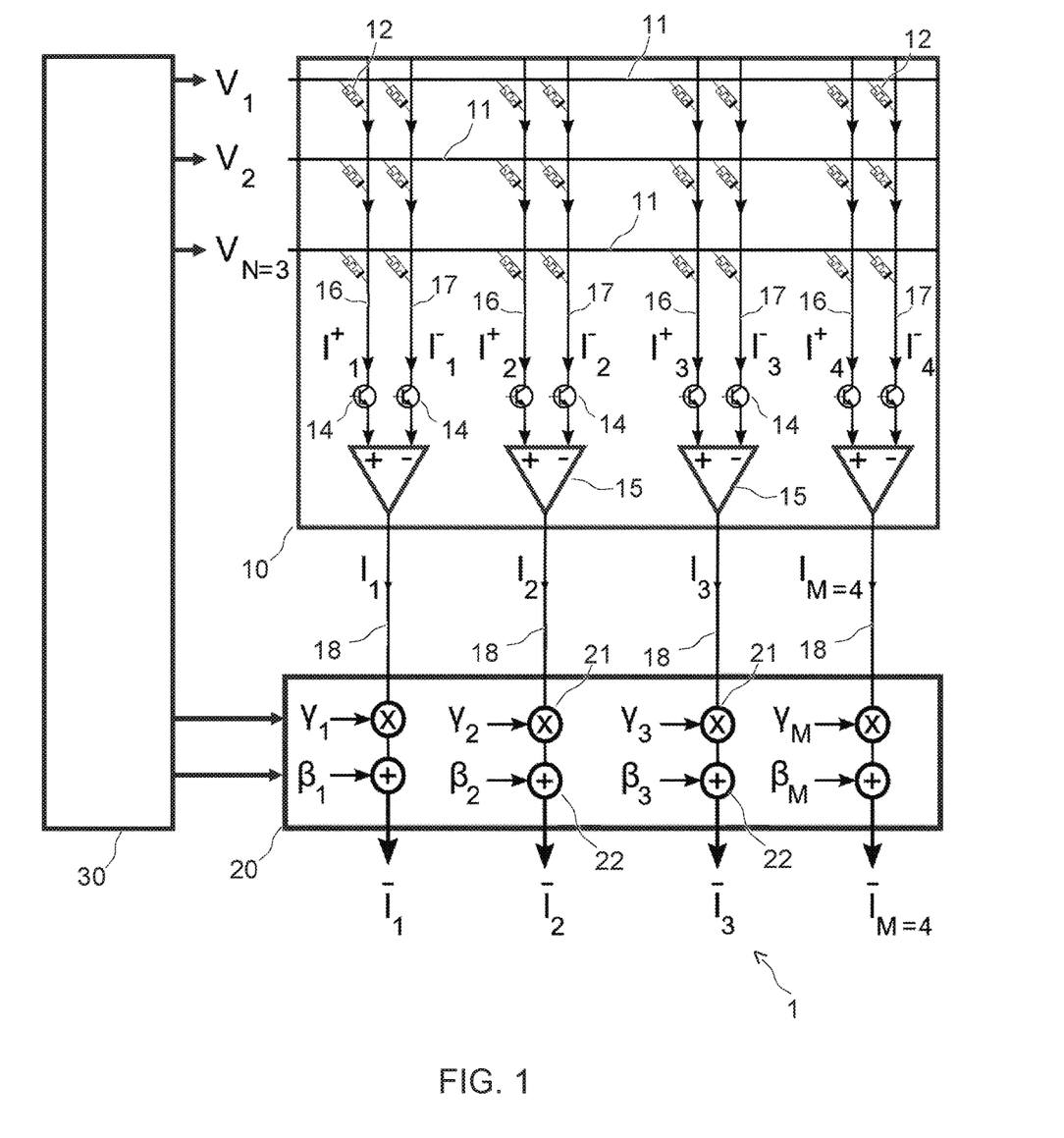
FIGS. 1, 2, 3A and 3B are high-level circuit diagrams of selected components of a neuromorphic system according to embodiments.

The system 1 includes a crossbar array structure 10, and a correction unit 20. In addition, in certain embodiments, the system 1 includes a signal generator unit (not shown), coupled to the crossbar array structure 10 and the correction unit 20, as well as a control unit 30, to apply voltage signals to the crossbar array structure 10 and operate the correction unit 20. The same control unit 30 may further be used to program electronic devices of the crossbar array structure 10, as discussed below. As shown in FIG. 1, in certain embodiments the signal generator unit forms part of the control unit 30.

Figure 2:
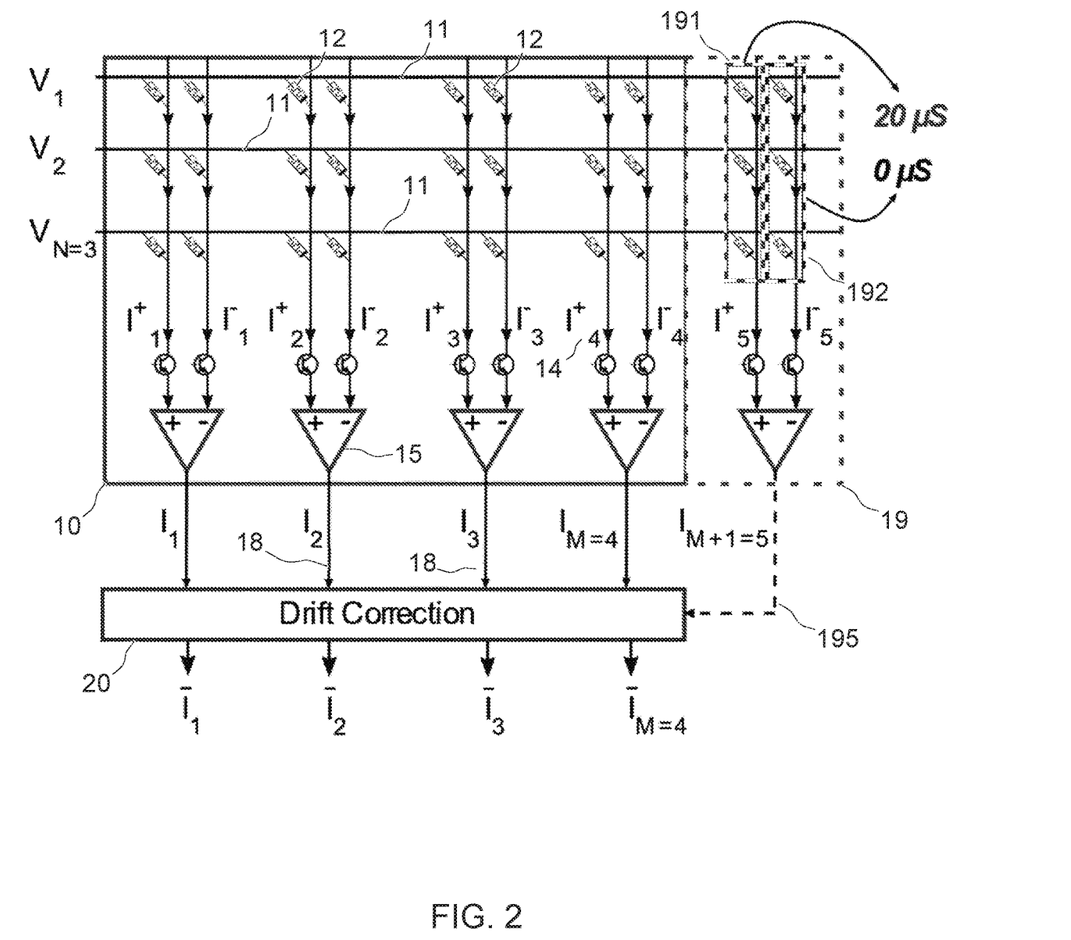

As shown in FIGS. 1-2, the crossbar array structure 10 includes rows 11 and columns 16-18, which are interconnected at junctions (i.e., intersections) via programmable electronic devices 12. The rows include input lines 11 for applying voltage signals across the electronic devices 12. The columns 16-18 include output lines 18 for outputting currents. In certain embodiments, the columns include dual lines 16, 17 as discussed above, but each column leads to a single output line. Transistors 14 and operational amplifiers 15 may be included along the columns to perform desired operations. Rows 11 and columns 16-18 relate to electrical paths that cross at junctions. However, it should be appreciated that the corresponding actual electrical conductors (or traces) do not necessarily need to be straight or orthogonal to each other.

As shown in FIG. 1, the correction unit 20 is connected to the output lines 18 of the crossbar array structure. The correction unit 20 may be, for example, an analog circuit, either connected to or integrated with the crossbar array structure 10. In other examples, the correction unit 20 is a digital processing unit connected to the crossbar array structure 10. Such variants involve analog-to-digital conversion of the currents from output lines 18, performed prior to inputting them to the unit 20. Despite the required conversion, a digital implementation of the correction unit 20 may be desired for higher flexibility and precision.

In the present embodiments, the correction unit 20 is configured to enable an affine transformation of currents outputted from each of the output lines 18, in operation. That is, the correction performed by the unit 20 is an affine function, which operates an affine transformation of the currents outputted from the crossbar array structure 10. An affine transformation includes a linear transformation and a translation. Thus, the correction may be regarded as involving a multiplicative coefficient $\gamma$ and an additive parameter $\beta$ (i.e., any output current I gives rise to a corrected current $\gamma I + \beta$). The coefficient $\gamma$ and the constant term $\beta$ are together referred to as the "affine transformation parameters." Such parameters are scalars in the present embodiments, and may be set to any desired value.

The present embodiments revolve around applying voltage signals (step S15) across the input lines 11, to produce output currents. This is normally achieved via a multiply-accumulate operation, as per the design of the crossbar array structure. In addition, the correction unit 20 is operated to correct at step S40 each of the output currents obtained at the output lines 18 according to the affine transformation, in order to compensate for temporal conductance variations in the electronic devices 12.

Figure 4:
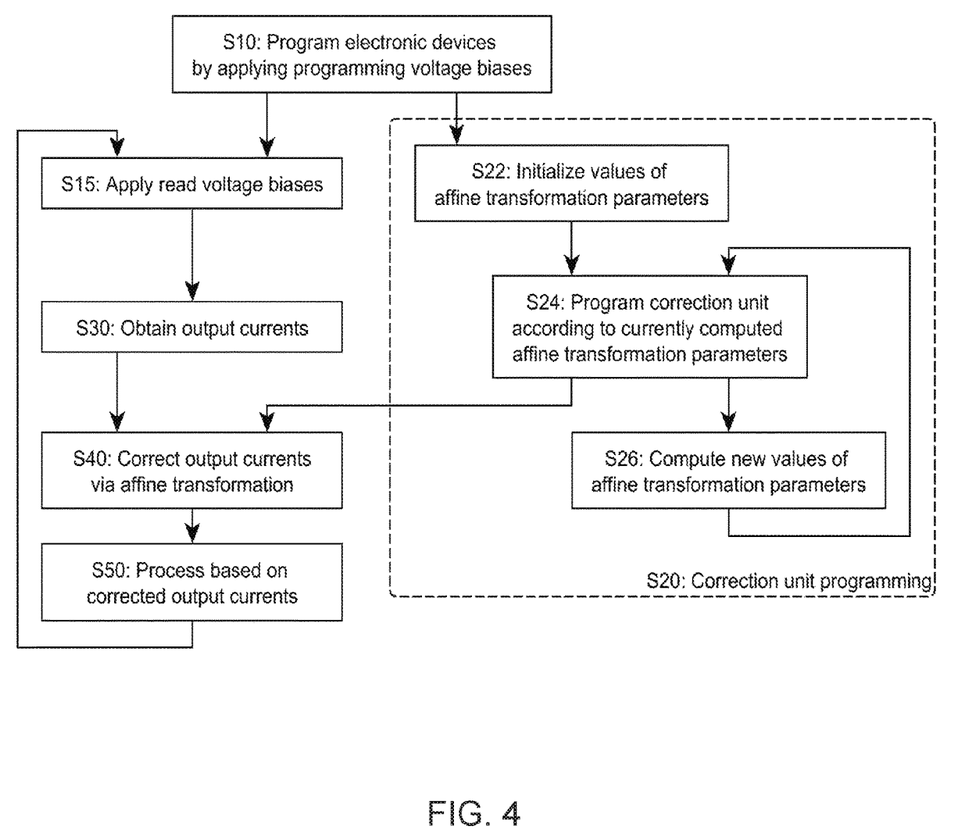
FIG. 4 is a flowchart illustrating high-level steps of a method of operating a system such as depicted in FIG. 1, as in embodiments.

In operation, the voltage signals applied at step S15 are read voltages, which are lower-intensity signals compared to programming voltages as initially used to program at step S10 the electronic devices 12 of the neuromorphic system 1 to set the electronic devices to predefined conductance values. In certain embodiments, the devices 12 are assumed to have already been programmed at step S10 to given conductance states at the time of applying the step S15 read voltage signals. That is, certain of the present methods comprise an initial step S10 of programming the electronic devices 12 of the neuromorphic system 1 by applying programming voltage signals across the input lines 11. Read voltage signals are normally applied at step S15 after having programmed the devices 12 at step S10, as shown in FIG. 4. In other words, the electronic devices 12 may initially be programmed at step S10 in view of performing multiple current readouts resulting from applications of read voltages at step S15 (e.g., as in memory applications or for inference purposes). However, the present current correction methods may be used for both inference and learning purposes, as described in further detail below. Thus, several cycles of programming the electronic devices 12 at step S10 may in fact be involved (FIG. 4 shows only one such cycle).

As discussed above, the correction unit 20 is operated to compensate for temporal conductance variations in the electronic devices 12. Such variations include conductance drifts (as may occur in PCM devices) but may also include conductance variations due to changes in the temperature of the neuromorphic device or electronic noise, for example. However, it should be appreciated that other sources of errors in the output currents may also be corrected with the present methods.

The present embodiments make it possible to retain accuracy in the values stored in the electronic devices 12 over longer time periods, compared to known methods of drift correction in similar applications, in particular when applied to crossbar-based inference accelerators. This approach is applicable to any crossbar implementation of electronic devices 12 that exhibit temporal conductance variations. Such devices 12 are typically memristive devices, such as phase-change memory (PCM) devices, resistive random-access memory (RRAM) devices, or static random-access memory (SRAM) devices. In other examples, flash cells may be used. Flash cells can be used for multi-level (MLC) storage, and they are not subject to conductance drifts. However, the conductance of a Flash cell is temperature dependent. Therefore, gradual changes in the ambient temperature will alter the stored conductance values, which can also be compensated for according to the present methods. Conductance variations due to temperature changes will occur in most of memristive devices, including PCM and RRAM devices.

The memristive crossbar structure may use low precision (i.e., a single memristive element 12 may be involved at any junction of the array 10). More generally, however, each junction may include one or more memristive devices. Also, dual output lines 16, 17 (in upper columns) may be involved, yielding double junctions (one to store positive values, and another to store negative values), as shown in FIGS. 1 and 2.

In certain embodiments, the electronic devices 12 may be programmed S10 so that the electronic devices 12 store synaptic weights of an artificial neural network (ANN). In other embodiments, the neuromorphic system 1 forms part of a memory-augmented neural network system, to enhance a neural network with an external memory. In each of the embodiments, output currents obtained from the output lines 18 will be obtained according to a multiply-accumulate operation, based on read voltage signals coupled at step S15 into the input lines 11 and values stored on the electronic devices 12, as described in detail below.

Figure 3A:
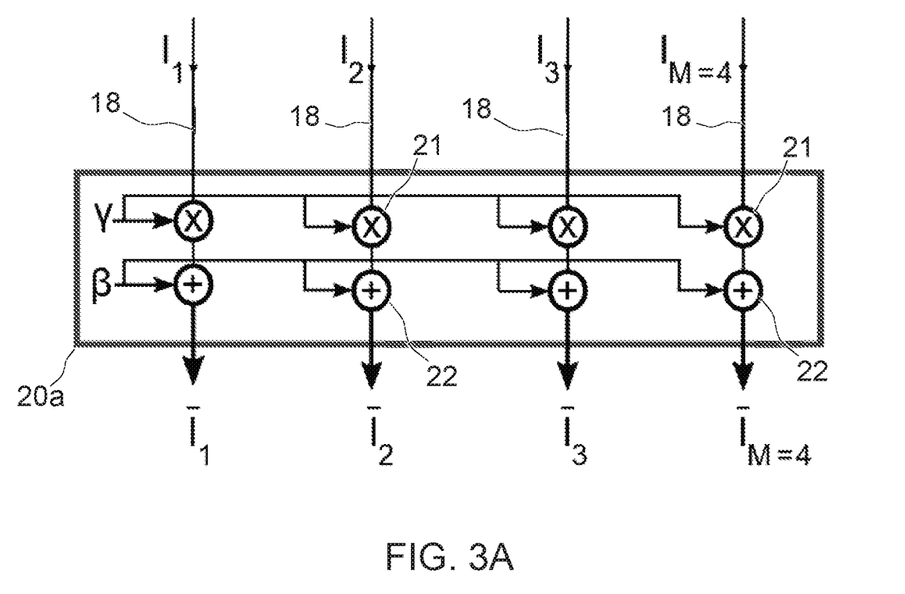
Figure 3B:
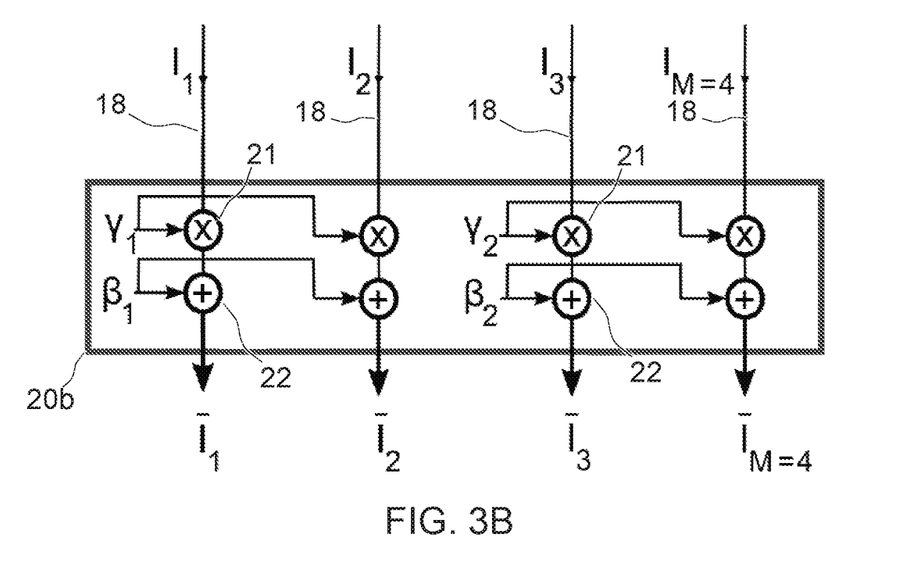

Initially, the correction at step S40 performed in respect of each of the output currents may be achieved by programming at steps S22, S24 the correction unit 20, according to programmable parameters of the affine transformation. As discussed earlier, such parameters include a multiplicative coefficient $\gamma$ and an additive parameter $\beta$. Thus, each output current may be corrected at step S40 according to programmable parameters. Such parameters used may be the same for all the output currents, as shown in the example of FIG. 3A. In other examples, subsets of the output currents are separately corrected, as shown in FIG. 3B. These parameters may be tailored for each output current (i.e., each output current may be individually corrected, as shown in FIG. 1).

In the embodiments shown in FIG. 1, the correction unit 20 is an analog module directly connected to the crossbar array structure 10, and the correction unit 20 may form part of the crossbar array structure 10. The junctions formed at the intersections between the rows and columns of the crossbar array structure 10 may be referred as first junctions. Similarly, the electronic devices 12 may be referred to as first electronic devices. In certain embodiments, the correction unit 20 is connected to the output lines 18 via second electronic devices 21, 22 arranged at second junctions. Each output current can thus be corrected S40 via the correction unit 20 by suitably programming the correction unit 20 at steps S22, S24.

The "programming" of the first electronic devices 12 and the second electronic device 21, 22 is achieved by coupling suitable signals into relevant input lines. For instance, the first electronic devices 12 of the crossbar array structure 10 can be programmed by applying at step S10 programming voltage biases to the input lines. Similarly, the second electronic devices 21, 22 of the correction unit 20 are programmed by coupling signals into each of the second electronic devices 21, 22 at the second junctions.

In certain embodiments, the correction unit 20 may be operated based on known good values or based on pre-computed values for the affine transformation. In other embodiments, however, the present methods further comprise computing at step S26 suitable values for the parameters of the affine transformation. In particular, one or more sets of values may be computed over time for the programmable parameters, in which case the correction unit 20 may be programmed at step S24 according to such sets of computed values. Methods for how these sets of values may be computed are described in detail below.

As discussed above, the same affine parameters $\gamma$ and $\beta$ may be used for all output currents, as shown in FIG. 3A, where same signals are coupled into each of the upper components 21 (for the multiplication) and the lower components 22 (for the addition). In contrast, in the example of FIG. 3B, two sets of output lines 18 can be distinguished. That is, columns 16-18 in the upper crossbar array structure (not shown) lead to two sets of output lines 18, the output currents of which can be decomposed in two sets, respectively. In that case, two sets of affine parameter values can be computed at step S26 for the programmable parameters. In that case, the correction unit 20 is programmed at step S24 according to the two sets of values computed. This makes it possible to separately correct at step S40 the two sets of output currents according to the two sets of computed values, respectively.

The same principle can be extended to three or more subsets of output currents, or even to each individual current, as shown in FIG. 1. There, the crossbar array structure 10 includes N input lines 11 and the columns 16-18 of the crossbar array structure 10 eventually form M output lines for outputting M output currents, respectively. In that case, M sets of affine parameter values can be computed at step S26 as programmable parameters. This way, the M output currents can be separately corrected at step S40 by the correction unit 20, according to the M set of values computed, respectively.

In the example of FIG. 2, the crossbar array structure 10 further includes an additional column 19, which is connected to the rows 11 at third junctions, via third electronic devices. The additional column 19 forms a dual line, involving devices that may be regarded as forming two subsets 191, 192. This additional column results in an additional output line 195, which outputs a reference current. As explained later, this reference current can be used to compute at step S26 the affine parameter values.

In particular, the third junctions may be programmed for the two subsets 191, 192 of the third electronic devices to exhibit distinct electrical conductances. The latter impacts the reference current outputted by the additional output line 195. That is, the electrical conductances of the third electronic devices vary across the dual lines of the additional column. Two or more additional columns may be used to output respective reference currents, if necessary. Detailed examples of how to compute affine parameters based on the reference currents are described below.

In certain embodiments, the programming of the correction unit 20 is performed as follows. The programmable parameters of the correction units are first initialized at step S22 to initial values (e.g., corresponding to an initial time t0). The initialization step S22 may be regarded as a first programming step of the correction unit 20. The correction unit parameters are typically initialized after having programmed S10 the electronic devices 12 of the crossbar array structure 10, but prior to computing at step S26 subsequent values for the programmable parameters (corresponding to a subsequent time t) of the correction unit 20. The latter is subsequently reprogrammed at step S24 according to the set of values subsequently computed at step S26.

In certain embodiments, the process repeats. That is, several time-dependent sets of affine parameter values may be computed at step S26 over time, whereby the correction unit 20 is repeatedly programmed at step S24 according to each time-dependent set of values computed at step S26, as shown in the flowchart of FIG. 4. That is, the correction unit 20 is programmed according to distinct values of affine transformation parameters, which vary over time, whereby the output currents are corrected at step S40 according to time-dependent affine parameters.

Algorithms according to certain embodiments are now discussed, which address particular ways of computing the affine transformation parameters.

Assume first that output currents are individually corrected, as in the example of FIG. 1. A current $I_j$ as obtained at the output of the $j^{th}$ column of the crossbar array structure may be erroneous, owing notably to a drift in the electrical conductance of, e.g., the PCM devices in that column. The current $I_j$ can nevertheless be corrected by using multiplicative coefficient $\gamma_j$ and an additive parameter $\beta_j$, as shown in equation 7 below:

$$\tilde{I}_j = \gamma_j \times I_j + \beta_j \tag{7}$$

Due to the exponential drift factor $(t/t0)^{-\nu}$ (see, equation 1), the spread of the distribution changes over time, and that can be corrected by $\gamma_j$. That is, the multiplicative coefficient $\gamma_j$ can be used to compensate for the change in the spread of the conductance distribution over time. In addition, due to the conductance state dependence and variability in $\nu$ (see, equation 2), the output current changes over time. This phenomenon can be corrected by the additive parameter $\beta_j$.

As discussed above, the values of $\gamma_j$ and $\beta_j$ can be periodically calibrated (i.e., adjusted) at step S26, during the operation of the system 1.

The affine transformation parameters may first be initialized, as reflected in FIG. 4. In practice, $\gamma_j$ may be initialized to 1 and $\beta_j$ may be initialized to 0 (e.g., right after programming all the devices 12 in the array 10).

In certain embodiments, the scaling factor $\gamma_j$ may be calibrated. To update $\gamma_j$, the quantity $\Gamma_{j|t0}$ is first computed (see, equation 7.1.a below) right after programming all the devices 12 in the array 10:

$$\Gamma_{j|t0} = \hat{I}_{j|t0}^{Vc} \tag{7.1.a}$$

This quantity is then stored for future computations.

Next, another quantity $\Gamma_{j|tc}$ is computed (see, equation 7.1.b below) at a time tc after programming all the devices in the array 10, and $\gamma_j$ is then updated based on the ratio of $\Gamma_{j|t0}$ to $\Gamma_{j|tc}$, as given by equation 7.1.c below:

$$\Gamma_{j|tc} = \hat{I}_{j|tc}^{Vc} \tag{7.1.b}$$

$$\gamma_j = \frac{\Gamma_{j|t0}}{\Gamma_{j|tc}} \tag{7.1.c}$$

These operations can be repeated multiple times throughout the operation of the crossbar array 10 (i.e., at distinct time instants tc, as shown in FIG. 4).

In certain embodiments, the additive factor $\beta_j$ may be updated. As described above, the additive factor $\beta_j$ compensates for errors in the expected value of the output current of the $j^{th}$ column. To update $\beta_j$, the quantity $B_{j|t0}$ is first computed (see, equation 7.1.d below) after programming all the devices 12 in the array 10. This quantity is then stored for future computations. Then, additional quantities $B_{j|tc}$ and $B_{M+1|tc}$ are computed at desired time instants tc (see, equations 7.1.e and 7.1.f below). Next, another quantity $\omega_j$ is computed (see, equation 7.1.g below) for the desired time tc and stored for future computations. The additive factor $\beta_j$ can accordingly be updated, at any time t, as a product of $\omega_j$ computed at tc and the current outputted from the $(M+1)^{th}$ column, using a given input voltage at time t. Note, M=3 in the examples of FIGS. 1-3 and M+1=4 refers to the additional column in the array 10, which serves to produce a reference current.

$$B_{j|t0} = I_{j|t0}^{Vc} \tag{7.1.d}$$

$$B_{j|tc} = \gamma_j \times I_{j|tc}^{Vc} \tag{7.1.e}$$

$$B_{M+1|tc} = I_{M+1|tc}^{Vc} \tag{7.1.f}$$

$$\omega_j = \frac{(B_{j|t0} - B_{j|tc})}{B_{M+1|tc}} \tag{7.1.g}$$

$$\beta_j = \omega_j \times I_{M+1|t} \tag{7.1.h}$$

The procedure can be repeated throughout the operation of the system 1, at several distinct desired time instants tc. For simplicity, all devices in a same line (i.e., two subsets 191, 192) of the $(M+1)^{th}$ column can be set to same conductance values. For example, devices in the first line 191 can be set to a conductance state of 20 μS, while the remaining devices in the second line 192 can be set to a conductance state of 0 μS. Such a scheme may improve the classification accuracy on the CIFAR-10 benchmark by up to 10%, according to tests performed using a 32-layer deep convolution neural network of a residual network family referred to as ResNet-32.

The above explanations pertain to cases where output currents are individually corrected. In other embodiments, all output currents may be subject to a same correction, as shown in FIG. 3A. That is, the current $I_j$ can be corrected using a same multiplicative coefficient $\gamma$ and a same additive term $\beta$:

$$\tilde{I}_j = \gamma \times I_j + \beta \tag{7.2}$$

Only two scalar coefficients $\gamma$ and $\beta$ are thus needed to correct the drift for all columns of the crossbar array 10 in that case. Note, the term $\beta$ is set to a value $\beta \neq 0$. However, the values of $\gamma$ and $\beta$ can be periodically adjusted during the operation of the crossbar.

In other variants, subsets of the output currents are individually corrected, as described above. That is, an output current $I_j$ is corrected according to parameters $\gamma_k$ and $\beta_k$. In particular, all columns may be divided into K separate groups (which do not necessarily correspond to contiguous subsets of columns in the array) and all columns of the $k^{th}$ group share the same parameters $\gamma_k$ and $\beta_k$. Thus, for the $j \in k^{th}$ group:

$$\tilde{I}_j = \gamma_k \times I_j + \beta_k \tag{7.3}$$

It should be appreciated that the groups may be dynamically defined, if needed.

In certain embodiments, the system 1 can be used as an external memory for a neural network or for executing a neural network (be it for training the network or for inference purposes). In certain embodiments, the electronic devices 12 are programmed at step S10 for the electronic devices 12 to store synaptic weights pertaining to connections to nodes of a single layer of an ANN. The output currents obtained at the output lines 18 are obtained according to a multiply-accumulate operation. This operation is based on read voltage signals applied at step S15 across the input lines 11 and values stored on each of the electronic devices 12 as per the programming at step S10 of the electronic devices 12.

In that respect, in the example of FIG. 1, the system 1 comprises a crossbar array structure 10 formed by N input lines 11 and M output lines 18. Only three input lines and four output lines are depicted in this example, for the sake of simplicity. In practice, however, hundreds (or more) of input lines would likely be involved. Similarly, hundreds (or more) of output lines may be needed. The controller 30 is used to program the devices 12, for them to store values or, more exactly, to have an electrical conductance interpretable as such values. The devices 12 may accordingly be programmed to store synaptic weights of an ANN. The controller 30 includes (or is connected to) a signal generator (not shown) to couple input signals (e.g., to apply voltage biases) into the input lines or directly into the second junctions 21, 22.

One or more readout circuits (not shown) are coupled to read out the M output signals (electrical currents) obtained from the M output lines. For example, a first readout circuit may be needed to read currents as directly outputted from the crossbar array 10, in order to feed corresponding values to a digital correction unit 20. A second readout circuit may then be needed to exploit the corrected values produced by this unit 20. In other cases, a single readout circuit may be needed to read currents as compensated by the unit 20 for conductance variations, should this unit 20 be directly connected to the array 10. The readout may be carried out according to a multiply-accumulate operation, which takes into account voltage signals coupled into each of the input lines 11, as well as signals coupled into the second junctions 21, 22. As per the multiply-accumulate operations performed, values stored on each of the electronic devices 12 impact the readout. The multiply-accumulate operation typically causes the signals coupled into the input lines to be respectively multiplied by values stored on the devices 12 at the junctions.

The architecture shown in the array 10 of FIG. 1 corresponds to connections to nodes of a single layer of nodes of an ANN, rather than a multilayer network. This architecture may, in principle, be expanded or stacked to embody several connected layers (hence capable of representing a multilayer network) or be connected to a core-to-core communication bus (e.g., forming part of the controller 30, possibly including digital processing units). Several crossbar array structures 10 such as shown in FIG. 1 may thus possibly be interconnected via this communication bus. Note, the correction unit 20 is preferably embodied as digital processing units, provided that suitable convertors are provided to translate the signals. However, in other embodiments, the correction unit 20 is implemented as an analog circuit.

The synaptic weights as stored on the devices 12 are constant for inference purposes, whereas they need be iteratively reprogrammed for learning purposes. The computation of the weight updates is normally performed by the controller 30, whereas the crossbar array structures 10 are used to perform all the basic operations needed for the ANN (i.e., matrix vector products for the forward evaluation, products of transposed matrices and error gradient vectors for the backward evaluation, and vector outer products for updating weights, which involve large vector-matrix multiplications). For the learning phase, the controller 30 may be used to re-program the devices 12, to alter synaptic weights stored thereon according to any suitable automatic learning process. Thus, a system 1 such as shown in FIG. 1 can serve both learning and inference purposes.

In certain embodiments, the present methods may compute batch normalization parameters to perform a batch normalization of the ANN layer implemented by the array 10. Batch normalization is achieved by scaling the multiplicative coefficient $\gamma$ and the additive term $\beta$ according to the computed batch normalization parameters. The latter normally includes batch normalization statistic parameters $\sigma_j$ and $\mu_j$ and batch normalization coefficients $A_j$ and $B_j$. Preferably, several time-dependent batch normalization statistic parameters are computed, while freezing the batch normalization coefficients (i.e., maintaining the batch normalization coefficients constant).

In other words, the above conductance variation correction methods, which involve two coefficients $\gamma_j$ and $\beta_j$ per column, may be combined with a batch normalization layer that has coefficients $A_j$, $B_j$ and statistic parameters $\sigma_j$ and $\mu_j$. Values of $A_j$, $B_j$, $\mu_j$ and $\sigma_j$ are obtained from the training of the ANN.

In general, a batch normalization layer normalizes a current $I_j$ from the $j^{th}$ column to have zero mean and a unit standard deviation, and then applies a different scale and shift:

$$\tilde{I}_j = A_j \times \frac{I_j - \mu_j}{\sigma_j} + B_j \tag{7.4.a}$$

Applying this principle to the corrected currents $\tilde{I}_j = \gamma_j I_j + \beta_j$ results in a new formulation of the multiplicative coefficients and the additive terms, respectively $\tilde{\gamma}_J$ and $\tilde{\beta}_j$ (see, equation 7.4.b):

$$\tilde{I}_j = \tilde{\gamma}_j \times I_j + \tilde{\beta}_j \qquad (7.4.b)$$

$$\tilde{\gamma}_j = \gamma_j \times \frac{A_j}{\sigma_j} \qquad (7.4.c)$$

$$\tilde{\beta}_j = B_j + A_j \times \frac{\beta_j - \mu_j}{\sigma_j} \qquad (7.4.d)$$

As discussed above, $\tilde{\gamma}_J$ and $\tilde{\beta}_j$ can be recomputed by computing $\gamma_j$ and $\beta_j$ (see, equations 7.4.c and 7.4.d).

The above method may be used for conductance variation correction without having to recompute the batch normalization parameters. However, in order to ensure that optimal values of the batch normalization parameters are used are used over time in spite of conductance variations, batch normalization statistic parameters $\sigma_j$ and $\mu_j$ may be recomputed over time to compensate for electrical conductance variations. Optimal values of batch normalization statistics $\sigma_j$, $\mu_j$ and coefficients $A_j$, $B_j$ are obtained after convergence of the DNN training. During inferences, the batch normalization operation in DNNs may be expressed in the form of an affine equation 7.5.b by adjusting the layer's coefficients as given by equations 7.5.c and 7.5.d below:

$$\tilde{I}_j = \gamma_j \times I_j + \beta_j \qquad (7.5.b)$$

$$\gamma_j = \frac{A_j}{\sigma_j} \qquad (7.5.c)$$

$$\beta_j = B_j - \frac{A_j}{\sigma_j} \times \mu_j \qquad (7.5.d)$$

The representation of equation 7.5.b, which combines all the batch normalization parameters into a single affine transformation, may be adopted as a common choice to implement batch normalization in hardware. With such a representation, $\gamma_j$ and $\beta_j$ can be calibrated by updating batch normalization layer statistics $\sigma_j$ and $\mu_j$, while freezing the values of the coefficients $A_j$ and $B_j$. Such a method may be applied to batch-normalized DNNs implemented with a crossbar array 10.

In DNNs with a batch normalization layer following the crossbar outputs, batch normalization statistics $\sigma_j$ and $\mu_j$ may be updated to compensate for errors caused by conductance variations in the devices 12. G2 W represents a single scalar factor derived from the device conductance to synaptic weight mapping by computing the ratio of maximum absolute weight value to maximum mean conductance value. Initially, the value of statistics $\sigma_j$ and $\mu_j$ (as obtained after programming all devices 12 a first time) is obtained from the converged DNN training. At any desired time tc, the mean and variance (see, equations 7.6.a and 7.6.c) of the outputs of the crossbar at every $j^{th}$ column is computed for P desired inputs to the crossbar. P distinct inputs need be obtained from a similar distribution than the training examples that were used to originally train the DNN in software.

Statistics computed at time tc may be used to update $\mu_j$ and $\sigma_j$ at time tc with a desired accumulation coefficient Q as given by equations 7.6.b and 7.6.d, respectively. Then, $\gamma_j$ and $\beta_j$ are recomputed at time tc, as given by equations 7.6.e and 7.6.f. This procedure may be repeated for desired sets of P distinct inputs to obtain optimal values for $\gamma_j$ and $\beta_j$. In practice, the accumulation coefficient Q may be sensitive to the value of P. Experiments show that for residual family DNNs, the relationship between Q and P may be represented by equation 7.6.g. However, Q can also be derived from any other heuristic or optimization algorithms.

$$\tilde{I}_j = \gamma_j \times I_j + \beta_j \qquad (7.6)$$

$$M_j = G2W \times E[I_{j|tc}]; \text{ over } P \text{ inputs} \qquad (7.6.a)$$

$$\mu_{j|tc} = Q \times \mu_{j|tc} + (1-Q) \times M_j \qquad (7.6.b)$$

$$V_j = E[(G2W \times I_{j|tc,p} - M_j)^2]; \text{ over } P \text{ inputs} \qquad (7.6.c)$$

$$\sigma^2_{j|tc} = Q \times \sigma^2_{j|tc} + (1-Q) \times V_j \qquad (7.6.d)$$

$$\gamma_{j|t} = \frac{A_j}{\sigma_{j|t}} \qquad (7.6.e)$$

$$\beta_{j|t} = B_j - \frac{A_j}{\sigma_{j|t}} \times \mu_{j|t} \qquad (7.6.f)$$

$$Q = (0.015)^{\frac{1}{P}} \qquad (7.6.g)$$

Batch normalization statistics updates may require global drift compensation to be applied at the output of the crossbar array. In this case, along with batch normalization statistics update, drift compensation may also be applied (e.g., using a method discussed above). To calibrate drift correction coefficients $\gamma_j$ and $\beta_j$, one may update statistics of the batch normalization layer, namely $\sigma_j$ and $\mu_j$. At any desired time tc, mean and variance (see, equations 7.6.a and 7.6.c) of the outputs of the crossbar at every $j^{th}$ column is computed for P desired inputs to the crossbar. Along with G2 W scaling, the drift compensation scale $\alpha$ is used, where $\alpha$ is computed and stored at desired time td (see, equations 7.7.a and 7.7.b). When recomputing the mean and variance at time tc, the $\alpha$ computed at tdc is used, where tdc is the last time before tc at which $\alpha$ was computed. Statistics computed at tc are used to update $\sigma_j$ and $\mu_j$ at time tc with a desired accumulation coefficient Q as given by equations 7.6.d and 7.6.f. Then, $\gamma_j$ and $\beta_j$ are recomputed at time tc using updated values of $\sigma_j$ and $\mu_j$ as given by equations 7.6.g and 7.6.h. This procedure may then be repeated for some batches of P distinct inputs to obtain optimal values for $\gamma_j$ and $\beta_j$. For example, one batch of 200 (=P) images or 10 batches of 50 (=P) images usually works well in practice. Other different combinations of (number of batches, number of images per batch) may work just as well.

$$\hat{I}_j^{V_c} = I_j^+ + I_j^-; V_1, V_2, \ldots, V_N = V_c \qquad (5)$$

$$\tilde{I}_j = \gamma_j \times I_j + \beta_j \qquad (7.7)$$

$$\alpha_{t0,td} = \sum_{j=1:M} \hat{I}_{j|t0,td}^{V_c} \qquad (7.7.a)$$

$$\alpha(td) = \frac{\alpha_{t0}}{\alpha_{td}} \qquad (7.7.b)$$

$$M_j(tc) = \alpha(tdc) \times G2W \times E[I_{j|tc}]; \text{ over } P \text{ inputs} \qquad (7.6.c)$$

$$\mu_{j|tc} = Q \times \mu_{j|tc} + (1-Q) \times M_j(tc) \qquad (7.6.d)$$

$$V_j(tc) = E[(\alpha(tdc) \times G2W \times I_{j|tc} - M_j)^2]; \text{ over } P \text{ inputs} \qquad (7.6.e)$$

-continued $$\sigma^2_{j|t_c} = Q \times \sigma^2_{j|t_c} + (1-Q) \times V_j(t_c) \quad (7.7.f)$$

$$\gamma_{j|t} = \alpha \times \frac{A_j}{\sigma_{j|t}} \quad (7.7.g)$$

$$\beta_{j|t} = B_j - \alpha \times \frac{A_j}{\sigma_{j|t}} \times \mu_{j|t} \quad (7.7.h)$$

Other procedures may be contemplated for DNNs implementations that have a normalization layer (called group normalization). During the inference phase, the group normalization layer in DNNs may be expressed in the form of drift correction equation by adjusting the layer's coefficients. Such a representation can potentially be adopted as a common choice to implement group normalization layer in hardware. Output columns of the crossbar are divided in K groups and outputs of all columns in a same group are used to compute normalization statistics. First, for the $k^{th}$ group of columns, mean and variance are computed from outputs of all the columns in that group as given by equations 8.1 and 8.2. Additionally, the drift compensation scaling factor $\alpha$ (as described above) may be used at the output of the crossbar. Then, $\gamma_j$ and $\beta_j$ are computed using statistics $\sigma_k$, $\mu_k$ and the trained parameters $A_j$ and $B_j$ as given by equations 8.3 and 8.4. $\sigma_k$ and $\mu_k$ are computed for every input to the crossbar (unlike batch normalization). Finally, $\gamma_j$ and $\beta_j$ may correct drift error in the output of the crossbar, owing to the nature of the normalization introduced by the group normalization. This method can be applied to group-normalized DNNs implemented with crossbar arrays. Finally, the layer normalization is a special case of a group normalization with K=M, and an instance normalization is a special case of group normalization with K=1.

$$\mu_k = G2W \times E[I_j]; \forall j \in k \quad (8.1)$$

$$\sigma^2_k = E[(G2W \times I_j - \mu_k)^2]; \forall j \in k \quad (8.2)$$

$$\gamma_j = \frac{A_j}{\sigma_k}; j \in k \quad (8.3)$$

$$\beta_j = B_j - \frac{A_j}{\sigma_k} \times \mu_k; j \in k \quad (8.4)$$

$$\bar{I}_j = \gamma_j \times I_j + \beta_j \quad (8.5)$$

Referring now to FIGS. 1-3, another aspect of the present embodiments is described which concerns a neuromorphic system 1. Other aspects of this system have already been described above in reference to the present methods, and therefore system 1 is only briefly described below. As explained above, the system 1 includes a crossbar array structure 10 and a correction unit 20. In addition, the system 1 may include a signal generator unit (not shown), coupled to the crossbar array structure 10 and the correction unit 20, as well as a control unit 30, to trigger the application of the voltage signals and operate the correction unit 20. The system 1 is thus an apparatus. The signal generator unit may be assumed to form part of the control unit 30. More generally, the control unit 30 may include several units or modules.

The crossbar array structure 10 includes rows and columns 16-18 interconnected at first junctions via programmable electronic devices 12. The rows include input lines 11 for applying voltage signals across the electronic devices 12 and the columns 16-18 form output lines for outputting currents, in operation. The correction unit 20 is connected to the output lines 18 and otherwise configured to enable an affine transformation of currents outputted from each output line 18. The control unit 30 is generally configured to apply read voltage signals across the input lines 11 and operate the correction unit 20 to correct each output current obtained from the output lines, as per application of the read voltage signals. The correction is operated according to said affine transformation, so as to compensate for temporal conductance variations in said electronic devices 12. And as explained above, the control unit 30 may further be configured to program the electronic devices 12, this time by applying programming voltage signals across the input lines 11.

In certain embodiments, the control unit 30 is further configured to program the correction unit 20 according to programmable parameters of the affine transformation (i.e., including a multiplicative coefficient $\gamma$ and an additive term $\beta$), so that each output current may be corrected S40 according to said programmable parameters, in operation.

As seen in FIGS. 1-3, in certain embodiments, the correction unit 20 may be connected to the output lines 18 via second electronic devices 21, 22 (at second junctions). The control unit 30 may thus be configured to program the correction unit 20 by coupling signals into each of the second junctions. In embodiments, the control unit 30 is further configured to compute one or more sets of values for said programmable parameters and program the correction unit 20 according to such sets of values, in operation.

In addition, the crossbar array structure 10 may include one or more additional columns, which are connected to said rows at third junctions via third electronic devices. As explained above, these additional columns may be used to obtain reference currents, and the control unit 30 may thus compute said sets of values based on said reference currents. In particular, the control unit 30 may be used to program said third junctions so as for at least two subsets of the third electronic devices to exhibit at least two, distinct electrical conductances, respectively.

In certain embodiments, the columns 16-18 include at least two sets of output lines for outputting at least two sets of output currents, respectively, and the control unit 30 is further configured to compute at least two sets of values for said programmable parameters and program the correction unit 20 according to said at least two sets of values, so as to separately correct said at least two sets of output currents according to respective ones of said at least two sets of values, in operation. Also, the control unit 30 may be configured to compute M sets of values for said programmable parameters, so that the M output currents may be corrected S40 according to respective ones of the M set of values, in operation.

The control unit 30 may be configured to program the correction unit 20 by initializing the programmable parameters after having programmed S10 the electronic devices 12, but prior to computing a set of values for the programmable parameters. Next, at a subsequent time, the unit 30 may reprogram the correction unit 20 according to the set of computed values. The control unit 30 may compute several, time-dependent sets of values for the programmable parameters, and thus repeatedly program the correction unit 20 according to the time-dependent sets of values, in operation.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, a "module" or "unit" may include hardware (e.g., circuitry, such as an application specific integrated circuit), firmware and/or software executable by hardware (e.g., by a processor or microcontroller), and/or a combination thereof for carrying out the various operations disclosed herein. For example, a correction unit may include one or more integrated circuits configured to enable an affine transformation of currents outputted from each of the output lines, while a control unit may include circuitry configured to apply voltage signals across the input lines (e.g., a signal generator) and operate the correction unit to correct each of the output currents obtained at the output lines according to the affine transformation, to compensate for temporal conductance variations in the electronic devices.

What is claimed is:

1. A method of operating a neuromorphic system, wherein the method comprises:
    applying voltage signals from first signal lines of a control unit across input lines of a crossbar array structure, the crossbar array structure including rows and columns interconnected at first junctions via programmable first electronic devices, the rows including the input lines for applying the voltage signals across the first electronic devices and the columns including output lines for outputting currents; and
    correcting each of the output currents obtained at the output lines according to an affine transformation to compensate for temporal conductance variations in the first electronic devices, the correcting including
        storing a multiplicative coefficient $\gamma$ for the affine transformation in programmable second electronic devices in response to receiving second voltage signals from the control unit, the programmable second electronic devices interconnected at second junctions between the output lines and second signal lines of the control unit,
        storing an additive parameter $\beta$ for the affine transformation in programmable third electronic devices in response to receiving third voltage signals from the control unit, the programmable third electronic devices interconnected at third junctions between the output lines and third signal lines of the control unit, and
        performing the affine transformation with an integrated circuit based on the stored multiplicative coefficient $\gamma$ and the stored additive parameter $\beta$.

2. The method according to claim 1, wherein the method further comprises:
    computing at least one set of values for the programmable parameters, wherein the second programmable electronic devices and third programmable electronic devices are programmed according to the at least one set of values computed.

3. The method according to claim 2, wherein:
    the columns include at least two sets of output lines outputting at least two sets of output currents, respectively;
    at least two sets of values are computed for said programmable parameters; and
    programming the second programmable electronic devices and third programmable electronic devices according to the at least two sets of values, to separately correct the at least two sets of output currents according to the at least two sets of values, respectively.

4. The method according to claim 3, wherein:
    the columns include M output lines outputting M output currents, respectively; and
    M sets of values are computed for the programmable parameters, for the M output currents to be separately corrected according to the M set of values, respectively.

5. The method according to claim 2, wherein
    the crossbar array structure further includes at least one additional column, which are connected to the rows at fourth junctions via fourth electronic devices, the additional columns including one or more additional output lines for outputting one or more reference currents, and
    the at least one set of values are computed according to the one or more reference currents.

6. The method according to claim 5, wherein the method further comprises programming the fourth junctions for at least two subsets of the fourth electronic devices to exhibit at least two, distinct electrical conductances, respectively, whereby the distinct electrical conductances impact the reference currents outputted by the additional output lines.

7. The method according to claim 2, wherein
    the programming comprises initializing said programmable parameters after having programmed the first electronic devices but prior to computing the at least one set of values for the programmable parameters, whereby the programming is performed according to the at least one set of values computed.

8. The method according to claim 7, wherein
    computing the at least one set of values includes computing several, time-dependent sets of values for said programmable parameters, wherein the programming comprises repeatedly programming the second programmable electronic devices and the third programmable electronic devices according to the time-dependent sets of values.

9. The method according to claim 1, wherein the method further comprises:
    programming the first electronic devices for the first electronic devices to store synaptic weights pertaining to connections to nodes of a single layer of an artificial neural network,
    wherein the output currents obtained at the output lines are obtained according to a multiply-accumulate operation based on the voltage signals applied across the input lines and values stored on each of the first electronic devices as programmed on the first electronic devices.

10. The method according to claim 9, wherein the method further comprises:
    computing batch normalization parameters; and
    performing a batch normalization of the layer by scaling the multiplicative coefficient $\gamma$ and the additive parameter $\beta$ according to the computed batch normalization parameters.

11. A neuromorphic system, comprising:
    a crossbar array structure that includes rows and columns interconnected at first junctions via first electronic devices, wherein the rows include input lines for applying voltage signals from first signal lines of a control unit across the first electronic devices and the columns include output lines for outputting currents;

a correction unit connected to the output lines and configured to enable an affine transformation of currents outputted from each of the output lines; and a control unit configured to
apply the voltage signals across the input lines, and
operate the correction unit to correct each of the output currents obtained at the output lines according to the affine transformation, to compensate for temporal conductance variations in the first electronic devices, wherein the correction unit is configured to store programmable parameters and includes programmable second electronic devices interconnected at second junctions between the output lines and second signal lines of the control unit, the second electronic devices configured to store a multiplicative coefficient $\gamma$ for the affine transformation in response to receiving second voltage signals from the control unit, programmable third electronic devices interconnected at third junctions between the output lines and third signal lines of the control unit, the third electronic devices configured to store an additive parameter $\beta$ for the affine transformation in response to receiving a third voltage signals from the control unit, and an integrated circuit configured to perform the affine transformation based on the stored multiplicative coefficient $\gamma$ and the stored additive parameter $\beta$.

12. The system according to claim 11, wherein
the control unit is further configured to compute at least one set of values for the programmable parameters and program the correction unit according to the at least one set of values computed, in operation.

13. The system according to claim 12, wherein
the crossbar array structure further includes one or more additional columns, which are connected to the rows at fourth junctions via fourth electronic devices, the additional columns including one or more additional output lines for outputting one or more reference currents, in operation, and
the control unit is further configured to compute said at least one set of values according to said one or more reference currents.

14. The system according to claim 13, wherein
the control unit is further configured to program said fourth junctions so as for at least two subsets of the third electronic devices to exhibit at least two, distinct electrical conductances, respectively.

15. The system according to claim 11, wherein
said columns include at least two sets of output lines for outputting at least two sets of output currents, respectively, and
the control unit is further configured to compute at least two sets of values for said programmable parameters and program the correction unit according to said at least two sets of values, so as to separately correct said at least two sets of output currents according to respective ones of said at least two sets of values, in operation.

16. The system according to claim 11, wherein
the control unit is further configured to compute several, time-dependent sets of values for said programmable parameters and repeatedly program the correction unit according to said time-dependent sets of values, in operation.

* * * * *